US006643197B2

(12) United States Patent
Chen et al.

(10) Patent No.: US 6,643,197 B2
(45) Date of Patent: Nov. 4, 2003

(54) SEMICONDUCTOR MEMORY DEVICE AND REDUNDANT OUTPUT SWITCH THEREOF

(75) Inventors: Ju-Fu Chen, Chiai Hsien (TW); Chao-Shuenn Hsu, Tainan Hsien (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/112,908

(22) Filed: Mar. 27, 2002

(65) Prior Publication Data

US 2002/0176296 A1 Nov. 28, 2002

(30) Foreign Application Priority Data

Mar. 28, 2001 (TW) ........................................ 90107364 A

(51) Int. Cl.[7] ................................................ G11C 7/00
(52) U.S. Cl. ................ 365/200; 365/225.7; 365/230.03
(58) Field of Search .............................. 365/200, 225.7, 365/230.03; 714/710, 711

(56) References Cited

U.S. PATENT DOCUMENTS 5,289,416 A * 2/1994 Iwai et al. .................. 365/200
5,379,259 A * 1/1995 Fujita ........................ 365/200
6,065,141 A * 5/2000 Kitagawa .................... 714/711

* cited by examiner

Primary Examiner—David Nelms
Assistant Examiner—Gene N. Auduong
(74) Attorney, Agent, or Firm—Ladas & Parry

(57) ABSTRACT

A semiconductor memory device featuring redundant output switches for routing all data transactions to corresponding redundant columns instead of defective columns. The memory device includes an ordinary decoder and an ordinary memory cell array having a plurality of ordinary columns. The ordinary decoder is provided for decoding an address signal to drive one of the ordinary memory cells in the ordinary columns. The memory device also includes a redundant memory cell array, a redundant decoder and a redundant switch circuit. The redundant memory cell array has a plurality of redundant columns adapted to replace defective columns in the ordinary columns. The redundant decoder has a plurality of redundant decode circuits, in which a redundant decode circuit provides a redundant decode signal to the corresponding redundant column for driving it. In response to the redundant decode signal and a select code, a redundant output switch in the redundant switch circuit couples one of the redundant columns to a data line corresponding to the defective column.

5 Claims, 9 Drawing Sheets

US 6,643,197 B2

SEMICONDUCTOR MEMORY DEVICE AND REDUNDANT OUTPUT SWITCH THEREOF

FIELD OF THE INVENTION

The present invention relates generally to semiconductor memory devices and, in particular, to redundant output switches for use in a semiconductor memory device.

BACKGROUND OF THE INVENTION

Many of today's semiconductor memory devices include redundant elements that are available to replace malfunctioning or defective elements. By including redundant elements on memory devices, the overall yield of marnfacture can be increased and improved. Therefore, the use of redundant elements on a memory chip to replace defective elements can result in lower capital manufacturing costs and earlier introduction of new products on existing wafer fab lines or in new process technologies.

As illustrated in FIG. 1, a conventional semiconductor memory device includes an ordinary memory cell array 11, an ordinary decoder 12, a redundant switch circuit 13 and a redundant memory cell array 14. Typically, the ordinary memory cell array 11 has a plurality of ordinary memory cells 11 (m,n) arranged in an M-column-by-N-row structure, where $1 \leq m \leq M$, $1 \leq n \leq N$ and M, N are a first and a second positive integers greater than one. That is, the ordinary memory cell array 11 includes M columns, and each column has N ordinary memory cells. In other words, the ordinary memory cell array 11 includes N rows, and each row has M ordinary memory cells.

The memory cell array 11 also comprises 1st through Mth bit lines or ordinary columns 11B-1 to 11B-M, and 1st through Nth word lines 11W-1 to 11W-N. Arn ordinary memory cell refers to 11 (m,n) that is connected to the mth bit line 11B-m and the nth word line 11W-n. As depicted in FIG. 1, the ordinary memory cell array 11 is coupled to a data bus 102. The ordinary memory cell array 11 is also connected to the ordinary decoder 12. The decoder 12 receives an address signal and its complement from an address bus 101. When a decode-inhibit signal 106 is de-asserted, the ordinary decoder 12 decodes the received pair of complementary address signals to generate a column and a row decode signals 104C, 104R and to provide them to the ordinary memory cell array 11.

The ordinary decoder 12 includes a row decoder 12R and a column decoder 12C. The row decoder 12R receives a row address and its complement. The decoder 12R decodes the pair of complementary row addresses to generate the row decode signal 104R. In similar fashion, the column decoder 12C receives a column address and its complement. The decoder 12C decodes the pair of complementary column addresses to generate the column decode signal 104C. The row decode signal 104R is provided for driving one of the N word lines. Lkewise, the column decode signal 104C is provided for driving one of the M bit lines.

Still referring to FIG. 1, the redundant memory cell array 14 has a plurality of redundant memory cells 14 (p,n) arranged in a P-column-by-N-row structure, where $1 \leq p \leq P$, $1 \leq n \leq N$ and P is a third positive integer greater than one. That is, the redundant memory cell array 14 includes P columns, and each column has N redundant memory cells. In other words, the redundant memory cell array 14 includes N rows, and each row has P redundant memory cells.

The redundant memory cell array 14 also comprises 1st through Pth bit lines or redundant columns 14B-1 to 14B-P, and 1st through Nth word lines 14W-1 to 14W-N. A redundant memory cell refers to 14 (p,n) that is connected to the pth bit line 14B-p and the nth word line 14W-n. The redundant switch circuit 13 is coupled between the redundant memory cell array 14 and the data bus 102 as shown in FIG. 1.

The semiconductor memory device is tested shortly after it is manufactured to find and identify ordinary columns that contain defective ordinary memory cells. If one or more defective columns are identified, they are replaced with redundant columns of the redundant memory cell array 14 such that the memory device having defective cells is still an acceptable product.

A defective column address for the ordinary memory cell array 11 is set by cutting isolation elements, such as fuses, in a redundant decoder 15. When a defective column is addressed, the redundant decoder 15 and the redundant switch circuit 13 operate in a manner that is transparent to the external circuitry thereby routing all data transactions to the corresponding redundant column instead of the defective column in the ordinary memory cell array 11.

Referring to FIG. 2, the redundant decoder 15 includes P redundant decode circuits 15-1~15-P that are each connected to a corresponding redundant column in the redundant memory cell array 14. As an illustrated example, the third positive integer P is equal to 2. Hence, the redundant decoder 15 has redundant decode circuits 15-1 and 15-2. Since the redundant decode circuits 15-1 and 15-2 are constructed and operate in a similar fashion, the detailed schematic diagram of the redundant decode circuit 15-2 is omitted in FIG. 2.

For illustration, the memory device described herein provides an 8-bit column address [X1T:X8T] and an 8-bit complementary column address [X1N:X8N]. Typically, a semiconductor memory device provides Q-bit column address and Q-bit complementary column address separately, where Q is a fourth positive integer greater than one. As depicted, the redundant decode circuit 15-1 includes sixteen NMOS transistors $20_1$~$20_{16}$, a PMOS transistor 21, sixteen fuses $22_1$~$22_{16}$, and an AND gate 206.

The PMOS transistor 21 has its source connected to a high voltage source, its drain connected to a common node 201, and its gate connected to a control circuit (not shown) to receive a control signal 103a. The fuses $22_1$~$22_{16}$ are coupled between each of the NMOS transistors $20_1$~$20_{16}$ and the common node 201. Each NMOS transistor ($20_1$~$20_{16}$) has its source connected to ground or a low voltage source, and its drain connected to the corresponding fuse ($22_1$~$22_{16}$) The odd numbered NMOS transistors $20_1$, $20_3$, . . . , $20_{15}$ have their gates receive the 8-bit column address [X1T:X8T] of the address signal; the even numbered NMOS transistors $20_2$, $20_4$, . . . , $20_{16}$ have their gates receive the 8-bit complementary column address [X1N:X8N] of the address signal.

One input terminal of the AND gate 206 is connected to the conmon node 201, the other input terminal of the AND gate 206 is connected to the control circuit (not shown) to receive a control signal 103b. The AND gate 206 generates a redundant decode signal 105-1 and provides it to the 1st redundant column in the redundant memory cell array 14 in FIG. 1. In similar fashion, the redundant decode circuit 15-2 receives the column address [X1T:X8T] and its complement [X1N:X8N], and the control signals 103a~b. Therefore, the redundant decode circuit 15-2 generates a redundant decode signal 105-2 and provides it to the 2nd redundant column in the redundant memory cell array 14 in FIG. 1. The redundant decoder 15 further includes an OR gate 203 receiving the redundant decode signals 105-1 and 105-2. The OR gate asserts the decode-inhibit signal 106 when the redundant decode signal 105-1 or 105-2 is activated.

Referring now to FIG. 3, the redundant switch circuit 13 comprises output set circuits 130-1 and 130-2 respectively receiving the redundant decode signals 105-1 and 105-2. Each output set circuit outputs a select code S-1/S-2 according to its internal setting. As illustrated in FIG. 4, each of the output set circuits 130-1 and 130-2 is constructed of PMOS transistors and fuses f-1~f-M (M=8, for example). By selectively cutting the fuses f-1~f-8, the pth output set circuit generates output signals [op1:op8] to form the select code S-p. For instance, each output select circuit 132-p is constructed of M switch devices $50_1$~$50_M$ (M=8) as shown in FIG. 5. Each of the switch devices $50_1$~$50_M$ has its input terminal coupled to the pth redundant column 14B-p, and has its output terminal coupled to the corresponding data line of the data bus 102. Whether the switch devices $50_1$~$50_M$ are made conductive or not, depending on the select code S-p, e.g., the output signals [op1:op8].

If two ordinary columns 11B-2 and 11B-B are found to be defective in the ordinary memory cell array 11, the redundant columns 14B-1 and 14B-2 in the redundant memory cell array 14 are mapped to replace the defective columns. The redundant decode circuits 15-1, 15-2 are programmed by selectively blowing fuses ($22_1$~$22_{16}$) so as to cut the connections required in order to register column addresses of the defective columns 11B-2 and 11B-8.

The external circuitry (not shown) is in communication with the ordinary column 11B-2 by way of a data line 102-2 of the data bus 102. Thus, the redundant column 14B-1 is required to couple to the data line 102-2 by way of the redundant switch circuit 13. All the fuses in the output set circuit 130-1 are cut except the 2nd fuse f-2 as illustrated in FIG. 4. When the defective column 11B-2 is addressed, the redundant decode signal 105-1 of the redurdant decoder 15 is logic "1" (as noted, the redundant decode signal 105-2 is logic "0"). Therefore, the output set circuit 130-1 generates the select code S-1 equal to "10111111". With reference to FIG. 5, the switch device $50_2$ of the output select circuit 132-1 is made conductive according to the select code S-1, e.g., [op1:op8]="10111111". As a result, the data line 102-2 is coupled to the redundant column 14B-1 instead of the defective column 11B-2.

In a similar manner, the external circuitry (not shown) is in communication with the ordinary column 11B-8 by way of a data line 102-8 of the data bus 102. Hence, the redundant column 14B-2 is required to couple to the data line 102-8 by way of the redundant switch circuit 13. As illustrated in FIG. 4, all the fuses in the output set circuit 130-2 are blown except the 8th fuse f-8. When the defective column 11B-8 is addressed, the redundant decode signal 105-2 of the redundant decoder 15 is logic "1" (as noted, the redundant decode signal 105-1 is logic "0") Thus, the output set circuit 130-2 generates the select code S-2 equal to "11111110". Referring to FIG. 5, the switch device $50_8$ of the output select circuit 132-2 is made conductive according to the select code S-2, e.g., [op1:op8]="11111110". Consequently, the data line 102-8 is coupled to the redundant column 14B-2 instead of the defective column 11B-8.

One problem with the implementation of the redundant switch circuit 13 according to the prior art is the chance of error during the cutting of the fuses in the output set circuits. For example, if the fuses f-1~f-8 in the output set circuit 130-p are blown incompletely, the output set circuit 130-p therefore generates an incorrect select code S-p. The incomplete cutting of the fuses can adversely affect the selective connection of the output select circuit 132-p. As a result, a neighborhood interference fault between the data lines 102-1~102-M is said to occur. Only special test patterns can screen for neighborhood interference faults. Unfortunately, even so, the special test patterns generally provide a partial solution to effective screen for such a failure mode.

Accordingly, what is needed is a novel redundant switch circuit that lowers the chance of incomplete cutting by reducing the total number of fuses. Further, it is desired to provide a semiconductor memory device incorporating the novel redundant switch circuit to improve the overall manufacture yield by preventing data lines from a neighborhood interference fault.

SUMMARY OF THE INVENTION

In accordance with one aspect of the invention, a semiconductor memory device includes an ordinary memory cell array and an ordinary decoder. The ordinary memory cell array, arranged in an M-column-by-N-row structure, includes M ordinary columns each of which has N ordinary memory cells, where M and N are a first and a second positive integers greater than one. Each ordinary column is respectively coupled to a corresponding data line of a data bus. The ordinary decoder is connected to the ordinary memory cell array. The ordinary decoder receives a decode-inhibit signal and an address signal, which is provided for decoding the address signal to drive one of the ordinary memory cells when the decode-inhibit signal is de-asserted. The memory device also includes a redundant memory cell array, a redundant decoder and a redundant switch circuit. The redundant memory cell array, arranged in a P-column-by-N-row structure, includes P redundant columns each having N redundant memory cells. The P redundant columns are adapted to replace defective columns in the M ordinary columns, where P is a third positive integer greater than one. If an mth ordinary column is identified as defective and it is replaced with a pth redundant column, the defective column is denoted as $X_{m-p}$ where $1 \leq m \leq M$ and $1 \leq p \leq P$. The redundant decoder is connected to the redundant memory cell array and the ordinary decoder, which includes P redundant decode circuits respectively receiving a column address of the address signal. In the P redundant decode circuits, a pth redundant decode circuit provides a pth redundant decode signal to the pth redundant column in the redundant memory cell array. The pth redundant decode circuit is employed to drive the pth redundant column when the pth redundant decode circuit receives the column address indicative of the defective column $X_{m-p}$. In addition, the redundant switch circuit has P redundant output switches. In response to the pth redundant decode signal and a pth select code, a pth redundant output switch in the P redundant output switches couples the pth redundant column to a mth data line of the data bus corresponding to the defective column $X_{m-p}$. The pth select code is generated by selectively cutting k fuses in the pth redundant output switch and where $k \leq M \leq 2^k$.

In accordance with another aspect of the invention, a redundant output switch is provided for use in a semiconductor memory device that has an ordinary memory cell array and a redundant memory cell array. The redundant output switch allows an ordinary column in the ordinary memory cell array to be replaced with a redundant column in the redundant memory cell array if the ordinary column is identified as a defective column. The switch redundant output includes an output set circuit having a plurality of fuses. The output set circuit sets a select code by selectively cutting the fuses. The switch redundant output also includes an output select circuit having an input terminal coupled to the redundant columns and a plurality of output terminals respectively coupled to a plurality of corresponding ordinary columns in the ordinary memory cell array. When the output select circuit receives the select code, it selectively couples the redundant column to the defective column.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE PREFERRED EMBODIMENT

Figure 1:
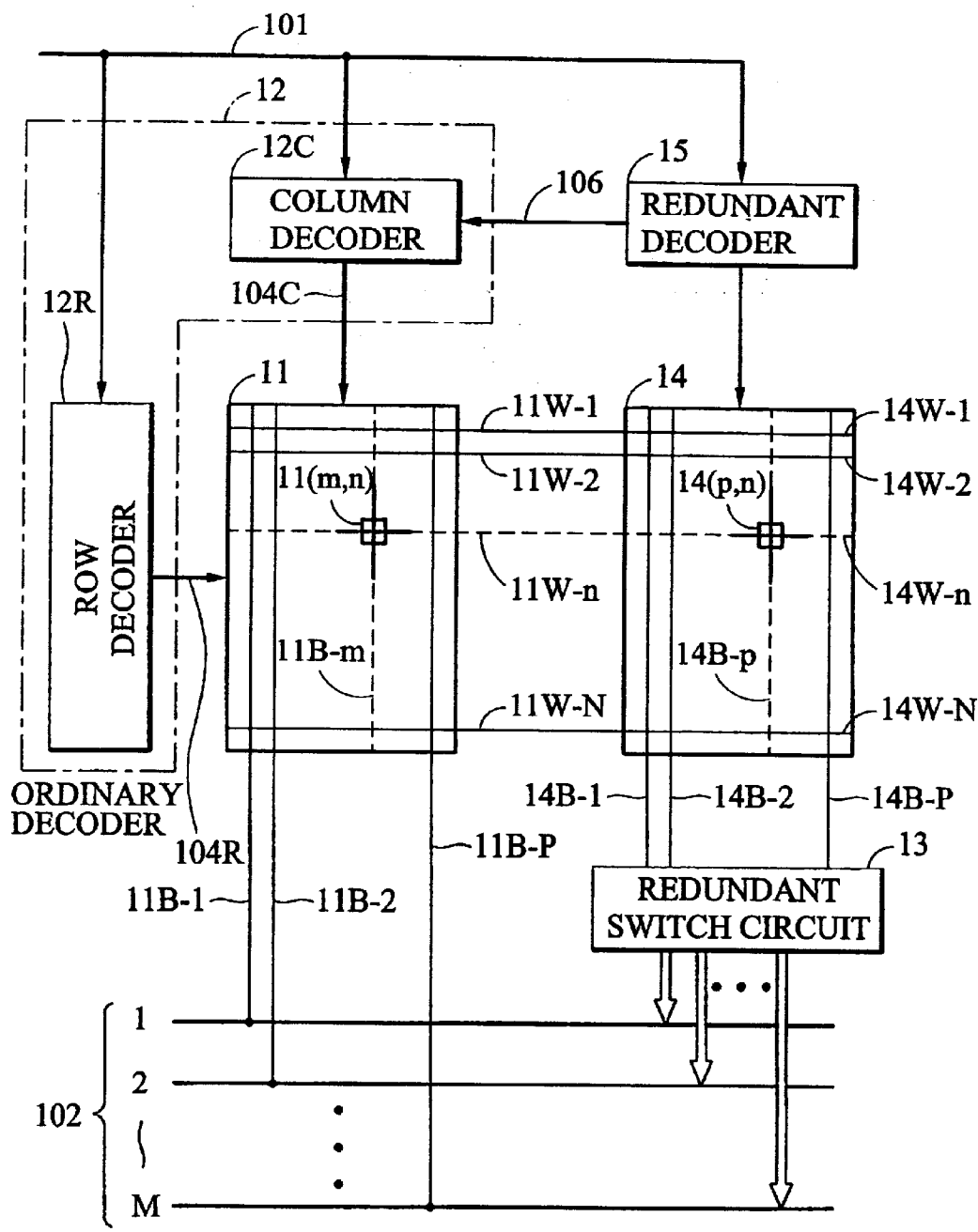
FIG. 1 is a block diagram of a semiconductor memory device in accordance with the prior art.
Figure 2:
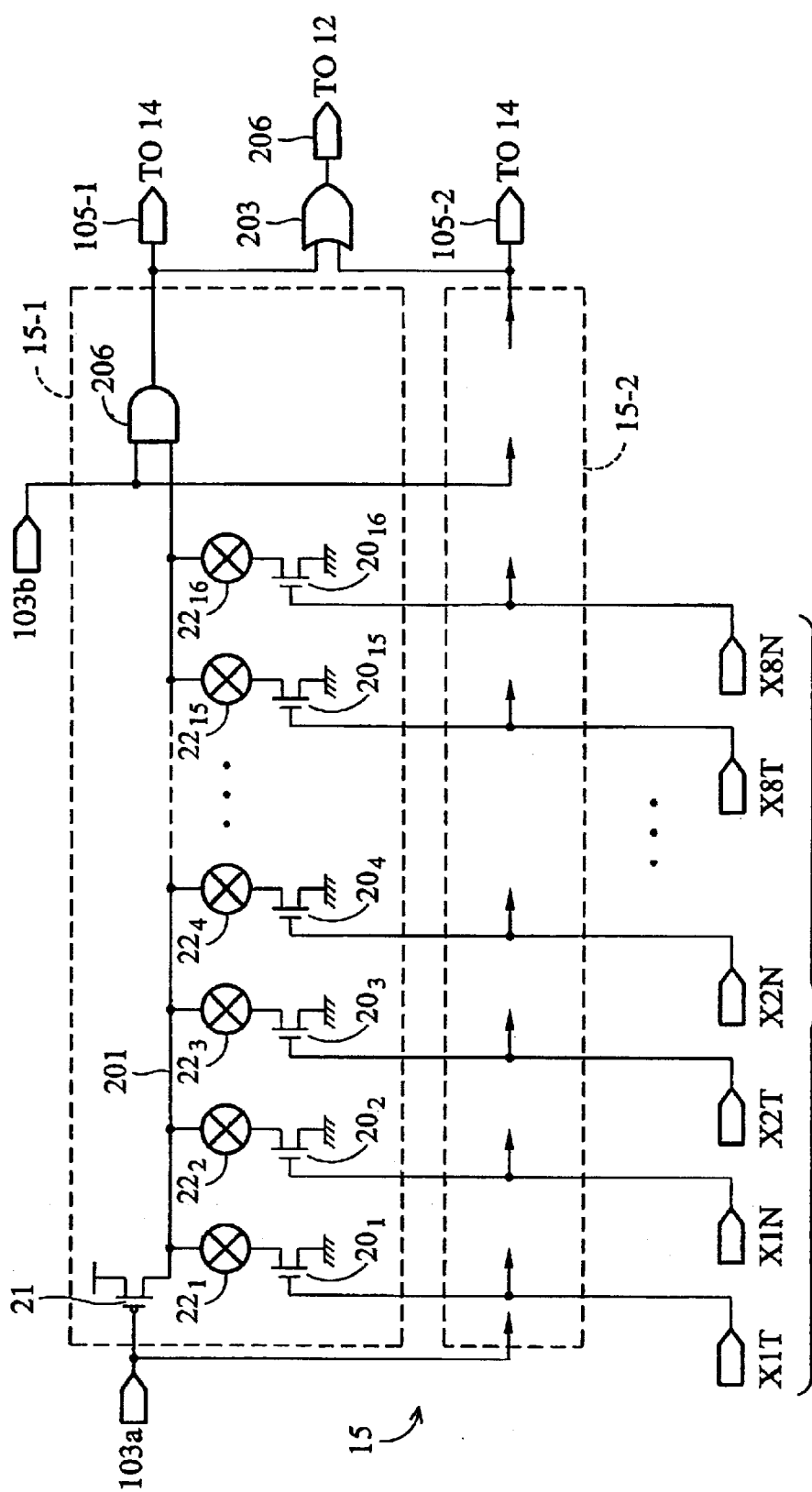
FIG. 2 is a schematic diagram of a redundant decoder of the memory device of FIG. 1.
Figure 3:
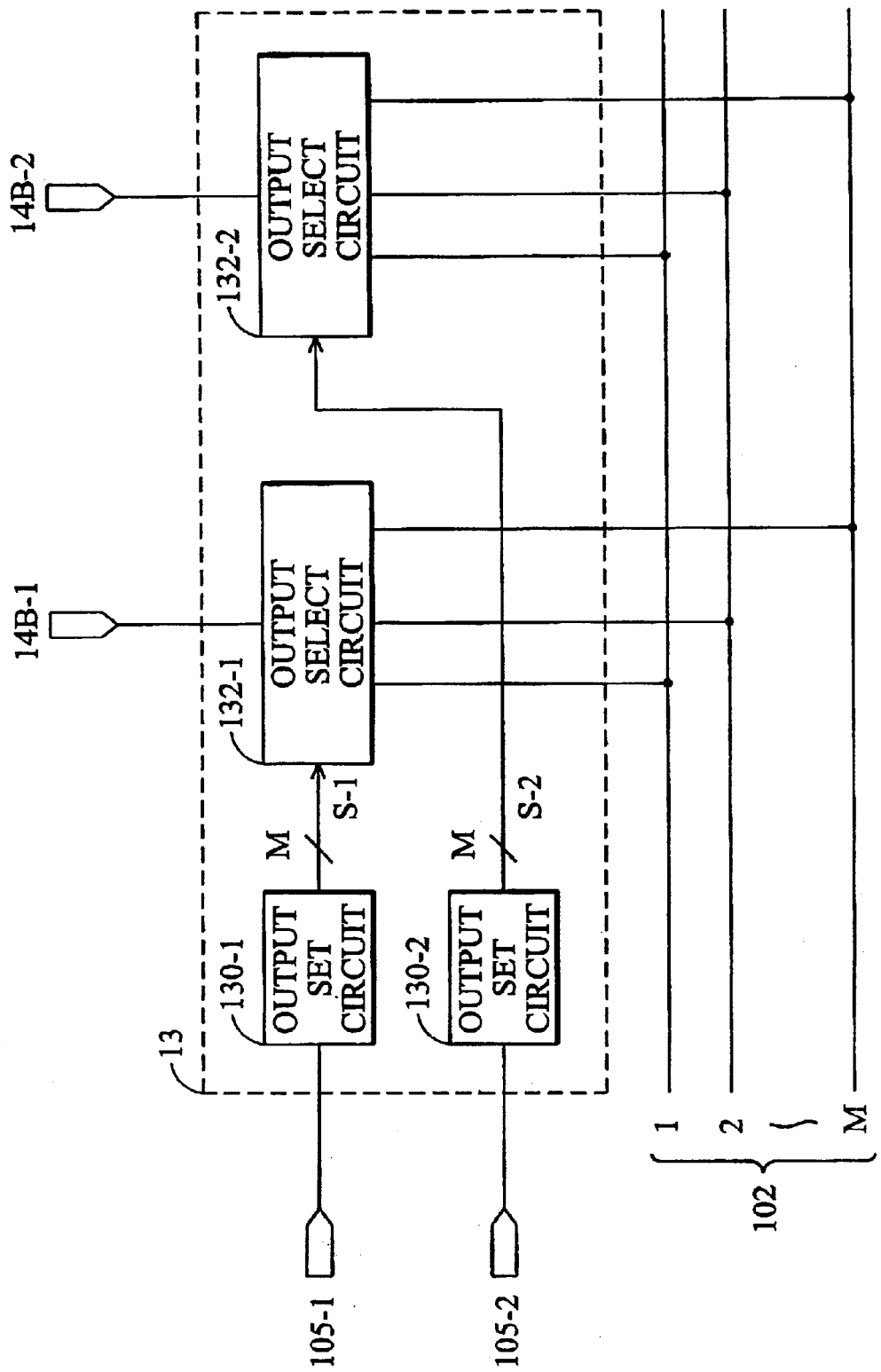
FIG. 3 is a block diagram of a redundant switch circuit of the memory device of FIG. 1.
Figure 4:
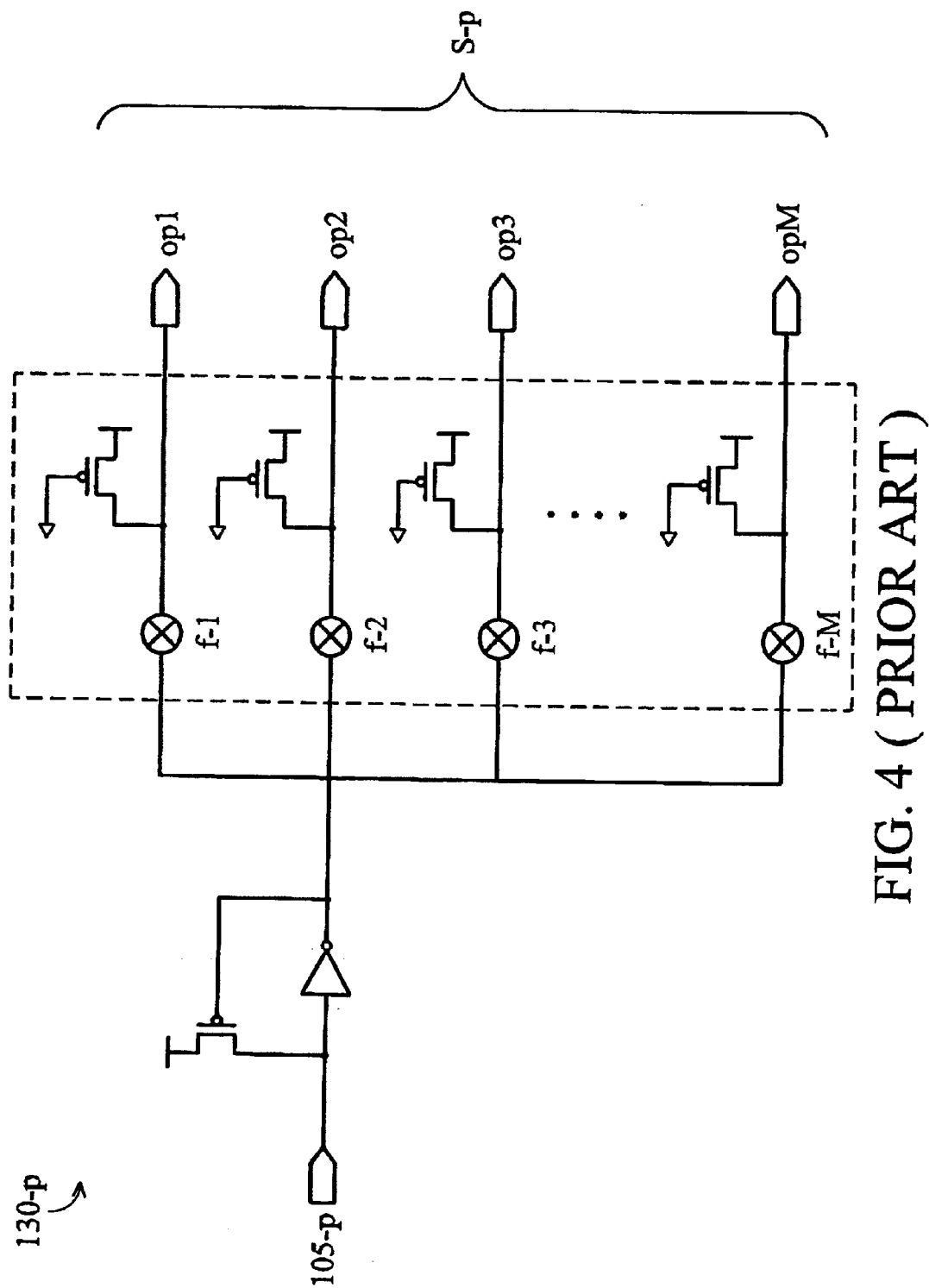
FIG. 4 is a schematic diagram of an output set circuit of the redundant switch circuit of FIG. 3.
Figure 5:
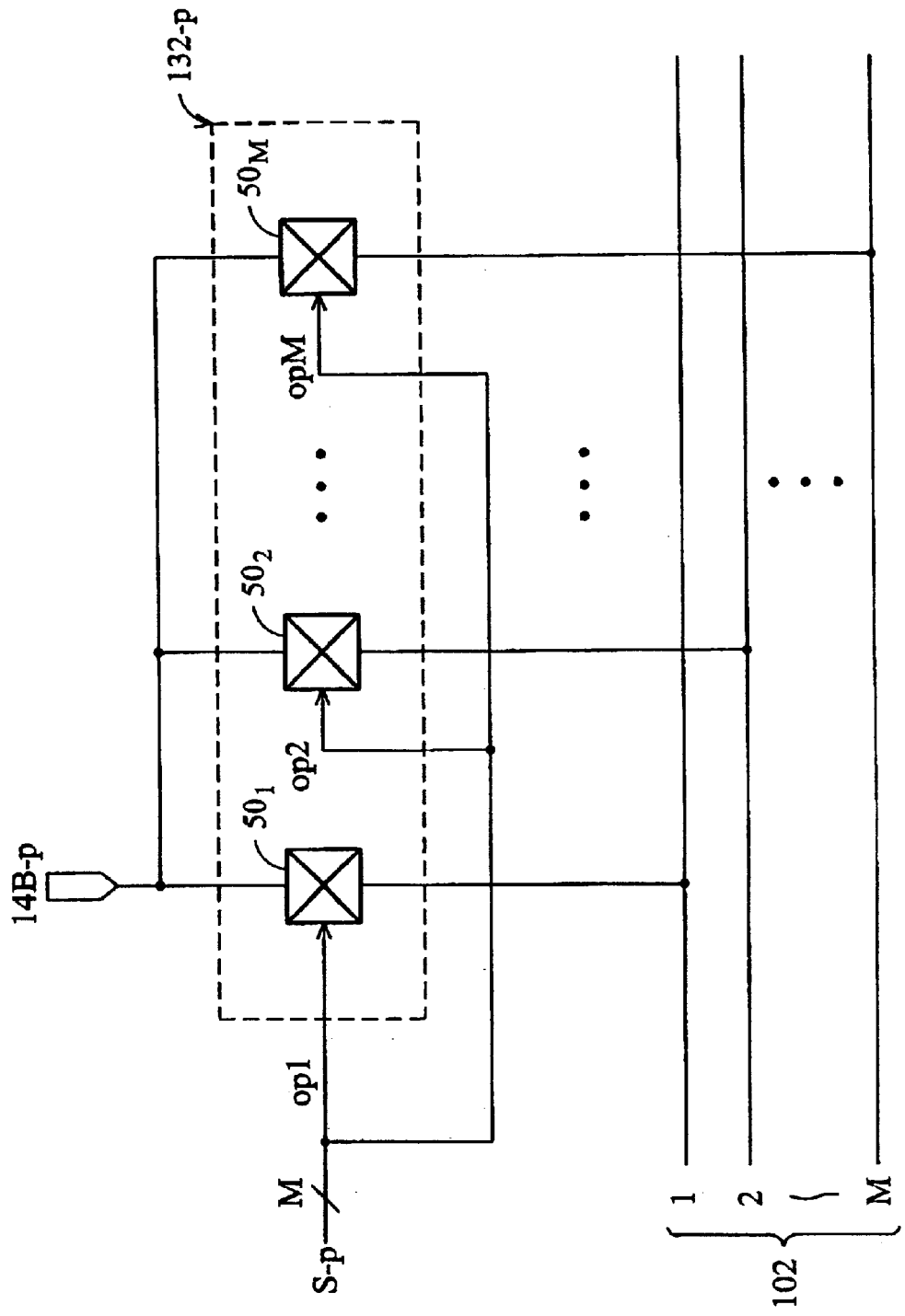
FIG. 5 is a schematic diagram of an output select circuit of the redundant switch circuit of FIG. 3.
Figure 6:
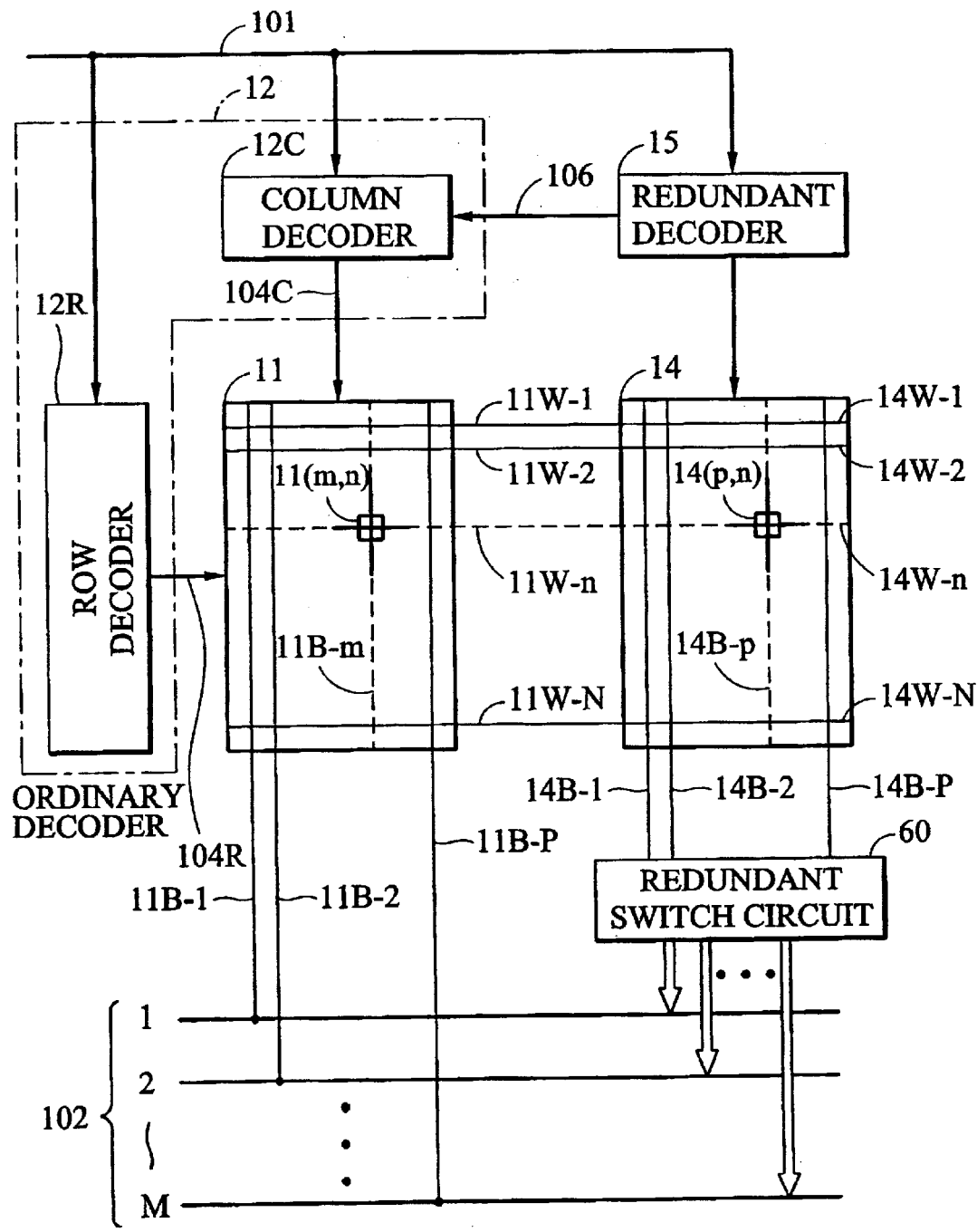
FIG. 6 is a block diagram of a semiconductor memory device in accordance with the present invention.

FIG. 6 illustrates a block diagram of a semiconductor memory device in accordance with the present invention. The memory device of the invention is distinguished from the conventional memory device of FIG. 1 by a redundant switch circuit 60 of FIG. 6. For clarity, like numerals and symbols refer to similar elements in FIGS. 1 and 6. Throughout the accompanying drawings, the similar or corresponding parts will not be repeatedly described hereinafter.

According to the invention, a semiconductor memory device includes an ordinary memory cell array 11, an ordinary decoder 12, a redundant switch circuit 13, a redundant memory cell array 14, a redundant decoder 15 and a redundant switch circuit 60. The ordinary memory cell array 11, arranged in an M-column-by-N-row structure, includes M ordinary columns 11B-1~11B-M each having N ordinary memory cells 11 (m,n), where $1 \leq m \leq M$, $1 \leq n \leq N$ and M, N are a first and a second positive integers greater than one. Each of the ordinary columns 11B-1~11B-M is respectively coupled to 1st through Mth data lines of a data bus 102. The ordinary decoder 12 is connected to the ordinary memory cell array 11. The ordinary decoder 12 receives a decode-inhibit signal 106 and an address signal, which is provided for decoding the address signal to drive one of the ordinary memory cells 11 (m,n) when the decode-inhibit signal 106 is de-asserted.

The redundant memory cell array 14, arranged in a P-column-by-N-row structure, includes P redundant columns 14B-1~14B-P each having N redundant memory cells 14 (p,n). The P redundant columns 14B-1~14B-P are adapted to replace defective columns in the M ordinary columns 11B-1~11B-M, where P is a third positive integer greater than one. If an ordinary column 11B-m is identified as defective and it is replaced with a redundant column 14B-p, the defective column is denoted as $X_{m-p}$ where $1 \leq m \leq M$ and $1 \leq p \leq P$. The redundant decoder 15 is connected to the redundant memory cell array 14 and the ordinary decoder 12, which includes P redundant decode circuits 15-1~15-P respectively receiving a column address of the address signal. In the P redundant decode circuits 15-1~15-P, a pth redundant decode circuit 15-p provides a pth redundant decode signal 105-p to the redundant column 14B-p in the redundant memory cell array 14. The redundant decode circuit 15-p is employed to drive the redundant column 14B-p when the redundant decode circuit 15-p receives the column address indicative of the defective column $X_{m-p}$.

Figure 7:
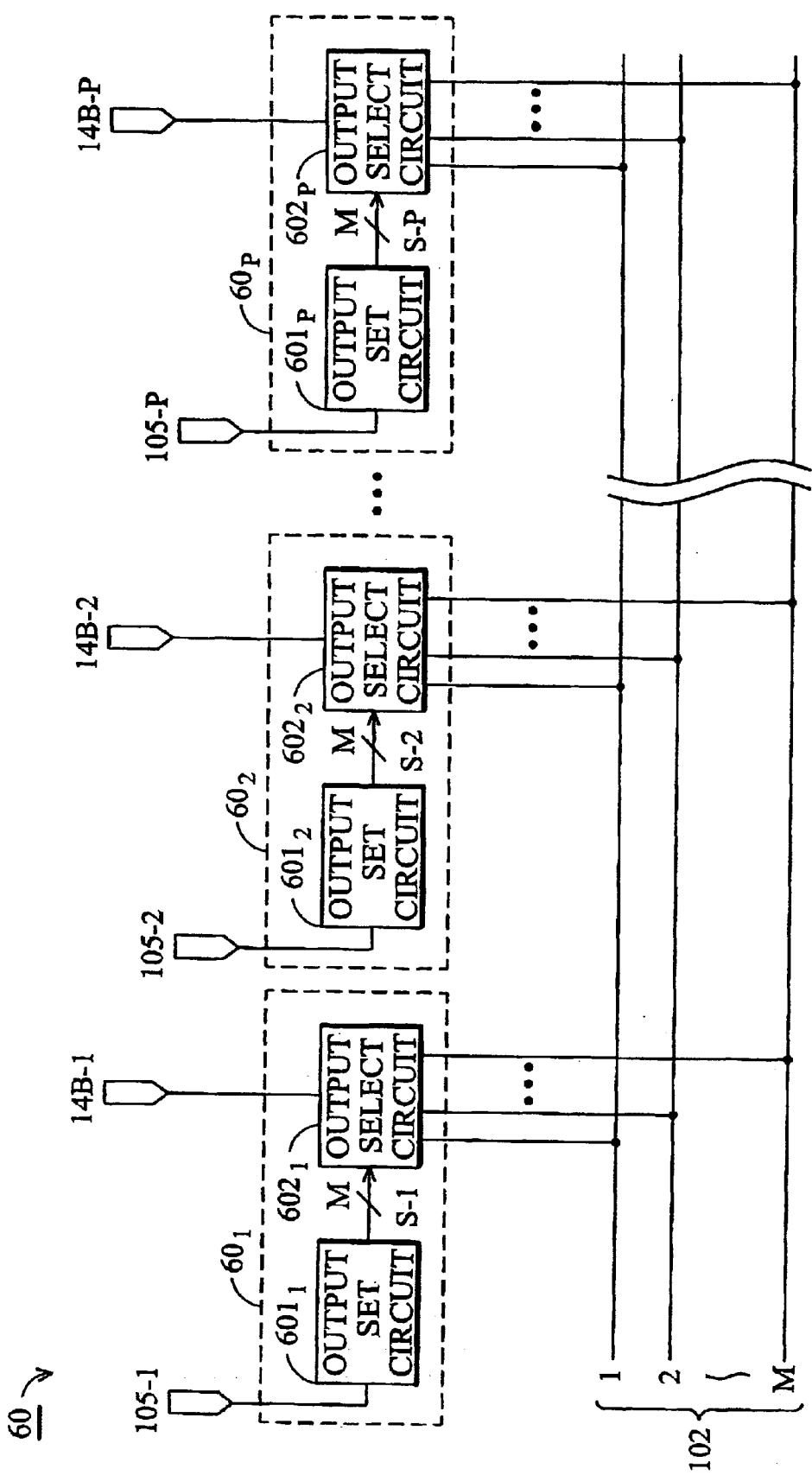
FIG. 7 is a block diagram of a redundant switch circuit of the memory device of FIG. 6.

Referring to FIG. 7, the redundant switch circuit 60 has P redundant output switches $60_1$~$60_P$. In response to the pth redundant decode signal 105-p and a pth select code S-p, a pth redundant output switch $60_p$ selects an mth data line 102-m corresponding to the defective column $X_{m-p}$ and couples the data line 102-m to the pth redundant column 14B-p The pth select code S-p is generated by selectively cutting k fuses in the pth redundant output switch $60_p$, and more particularly, where $k<M \leq 2^k$. As depicted, the pth redundant output switch 60 includes a pth output set circuit $601_p$ and a pth output select circuit $602_p$. The pth output set circuit $601_p$ is configured to set the pth select code S-p by selectively cutting the internal k fuses, i.e., the select code S-p is binary encoded according to selective cutting of the k fuses in the pth output set circuit. The output set circuit $601_p$ produces the pth select code S-p when it receives the pth redundant decode signal 105-p. The pth output select circuit $602_p$ has its input terminal coupled to the pth redundant column 14B-p, and has its M output terminals respectively coupled to the corresponding data lines 102-1~102-M. When the pth output select circuit $602_p$ receives the pth select code S-p, it selectively couples the pth redundant column 14B-p to the mth data line 102-m corresponding to the defective column $X_{m-p}$.

In one embodiment, if the ordinary memory cell array 11 provides eight (M=8) ordinary columns 11B-1~11B-8, the data bus 102 thus provides eight data lines 102-1~102-8. The output set circuit $601_p$ is required to include three (k=3) fuses F1~F3 so as to exactly select a data line corresponding to the defective column $X_{m-p}$ from the data lines 102-1~102-8.

Figure 8:
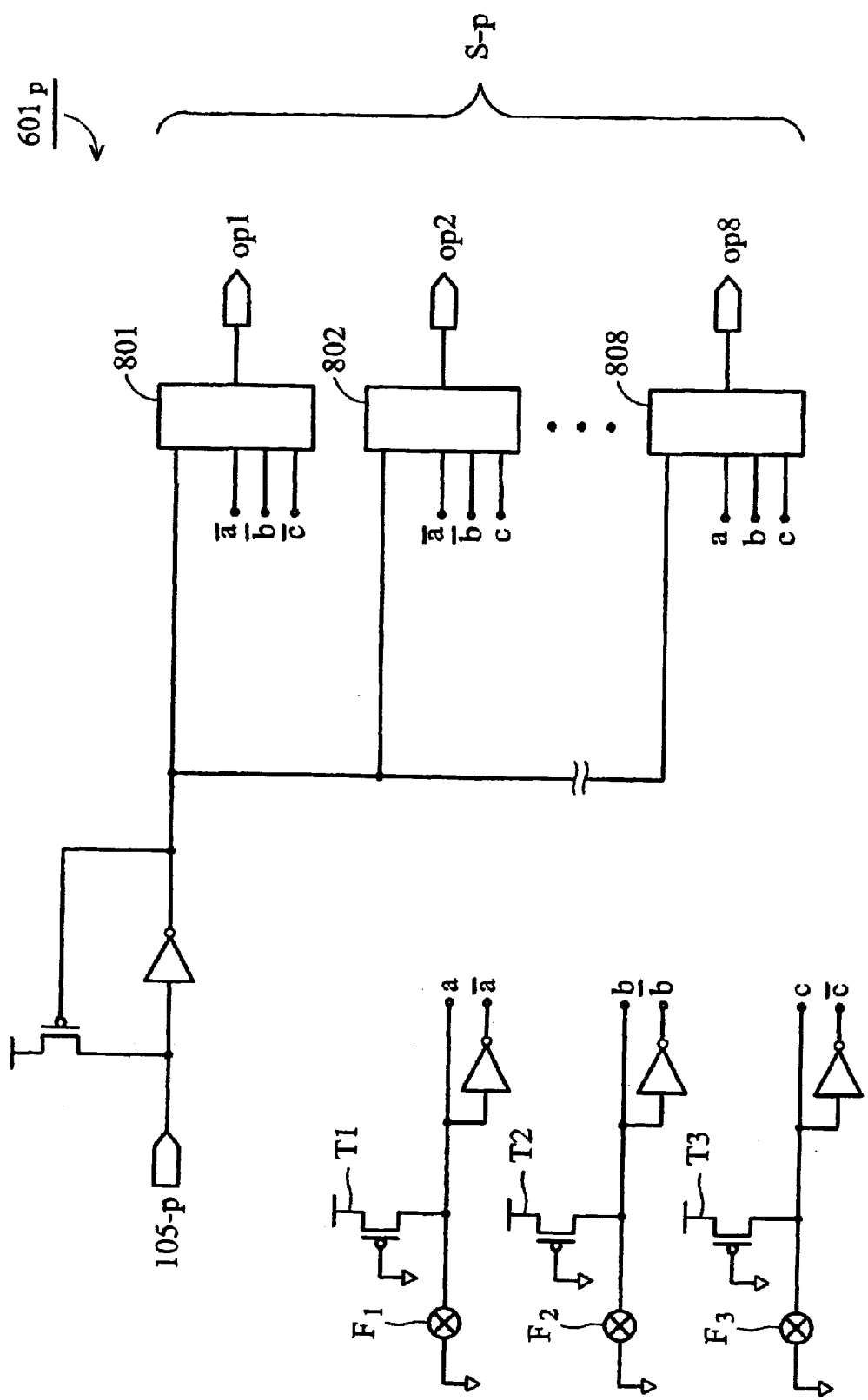
FIG. 8 is a schematic diagram of an output set circuit of the redundant switch circuit of FIG. 7.

FIG. 8 illustrates a schematic diagram of the output set circuit $601_p$ of the invention. As depicted, the fuses F1~F3 and corresponding PMOS transistors T1~T3 determine logic values of signals a, b and c, respectively. If the fuse F1 is cut, signal a is logic "1" and its complement $\bar{a}$ is logic "0". If the fuse F2 is cut, signal b is logic "1" and its complement $\bar{b}$ is logic "0". Likewise, if the fuse F3 is cut, signal c is logic "1" and its complement $\bar{c}$ is logic "0". The pth output set circuit $601_p$ further includes eight logic circuits 801~808. When the pth redundant decode signal 105-p is logic "1", the logic circuits 801~808 are enabled to decode input signals a($\bar{a}$), b($\bar{b}$) and c($\bar{c}$) into the select code S-p ([op1:op8]) as indicated in FIG. 8. The table for decoding the input signals a($\bar{a}$), b($\bar{b}$) and c($\bar{c}$) is given in Table 1 below, as implemented in accordance with one embodiment of the invention.

TABLE 1

| Fuses | | | Inputs | | | | | | Select Code S-p |
|---|---|---|---|---|---|---|---|---|---|
| F1 | F2 | F3 | a | b | c | $\bar{a}$ | $\bar{b}$ | $\bar{c}$ | [op1:op8] |
| O | O | O | 0 | 0 | 0 | 1 | 1 | 1 | 10000000 |
| O | O | X | 0 | 0 | 1 | 1 | 1 | 0 | 01000000 |
| O | X | O | 0 | 1 | 0 | 1 | 0 | 1 | 00100000 |
| O | X | X | 0 | 1 | 1 | 1 | 0 | 0 | 00010000 |
| X | O | O | 1 | 0 | 0 | 0 | 1 | 1 | 00001000 |
| X | O | X | 1 | 0 | 1 | 0 | 1 | 0 | 00000100 |
| X | X | O | 1 | 1 | 0 | 0 | 0 | 1 | 00000010 |
| X | X | X | 1 | 1 | 1 | 0 | 0 | 0 | 00000001 |

Note: The X represents that the fuse is cut (i.e., made nonconductive), and the O represents that the fuse is conductive.

Figure 9:
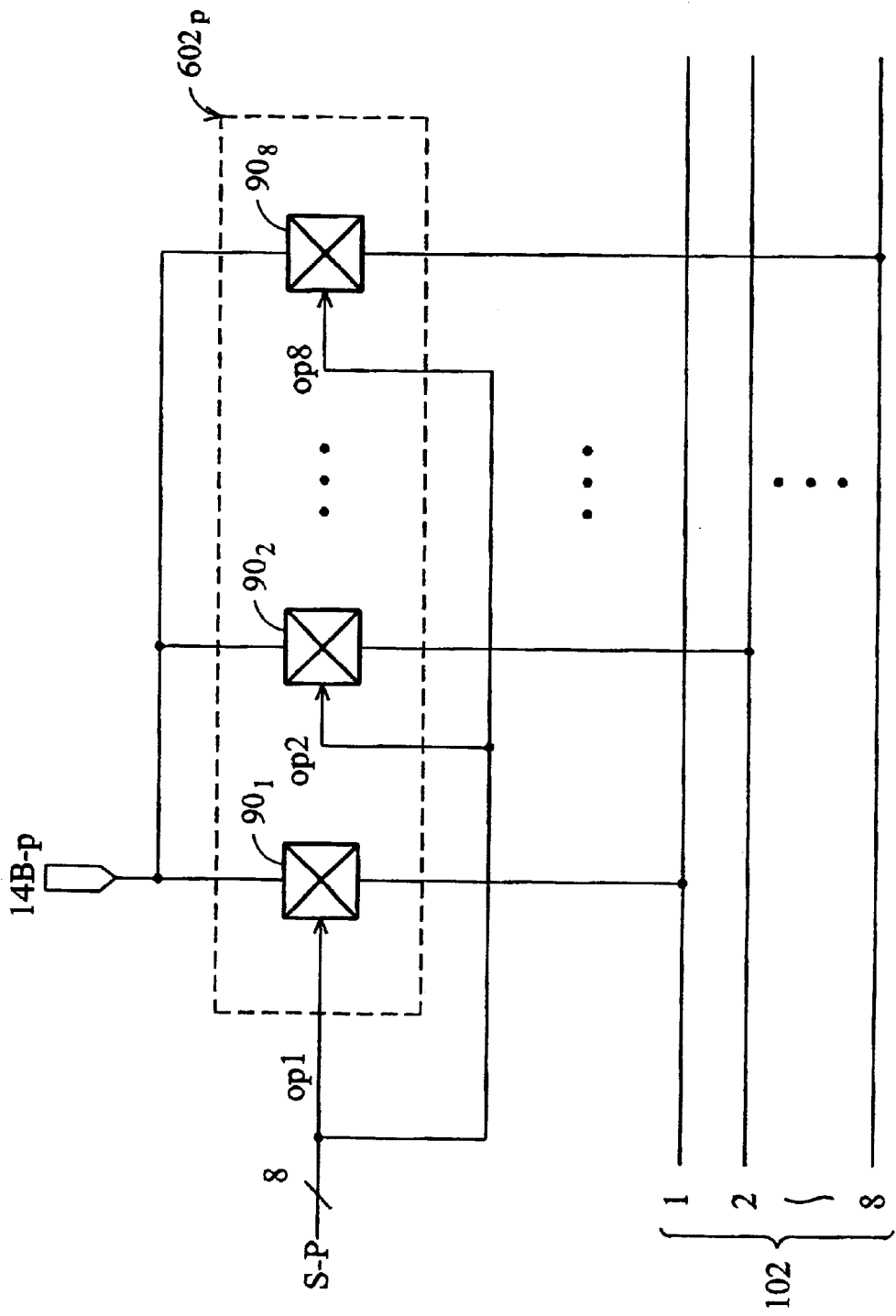
FIG. 9 is a schematic diagram of an output select circuit of the redundant switch circuit of FIG. 7.

As illustrated in FIG. 9, the pth output select circuit $602_p$ is constructed of eight (M=8) switch devices $90_1$~$90_8$. Each of the switch devices $90_1$~$90_8$ has its input terminal coupled to the pth redundant column 14B-p, and has its output terminal coupled to the corresponding data line of the data bus 102. Whether the switch devices $90_1$~$90_8$ are made conductive or not, depending on the select code S-p, e.g., the output signals [op1:op8] of the pth output set circuit $601_p$.

If two ordinary columns 11B-2 and 11B-8 are identified as defective columns in the ordinary memory cell array 11, the redundant columns 14B-1 and 14B-2 in the redundant memory cell array 14 are mapped to replace the ordinary columns 11B-2 and 11B-8. The redundant decode circuits 15-1, 15-2 are programmed by selectively blowing fuses ($22_1$~$22_{16}$) so as to cut the connections required in order to register column addresses of the defective columns 11B-2 and 11B-8.

An external circuitry (not shown) communicates with the ordinary column 11B-2 by way of a data line 102-2 of the data bus 102. Thus, the redundant column 14B-1 is required to couple to the data line 102-2 by way of the redundant switch circuit 60. According to Table 1, the fuse F3 in the 1st output set circuit $601_1$ is cut. When the defective column 11B-2 is addressed, the redundant decode signal 105-1 of the redundant decoder 15 is logic "1" (as noted, the redundant decode signal 105-2 is logic "0") Therefore, the 1st output set circuit $601_1$ generates the 1st select code S-1 equal to "01000000". Referring to FIG. 9, the switch device $90_2$ of the 1st output select circuit $602_1$ is made conductive according to the select code S-1, e.g., [op1:op8]="01000000". As a result, the data line 102-2 is coupled to the redundant column 14B-1 instead of the defective column 11B-2.

In a similar manner, the external circuitry (not shown) is in communication with the ordinary column 11B-8 by way of a data line 102-8 of the data bus 102. Hence, the redundant column 14B-2 is required to couple to the data line 102-8 by way of the redundant switch circuit 60. In accordance with Table 1, all the fuses F1~F3 in the 2nd output set circuit $601_2$ are blown. When the defective column 11B-8 is addressed, the redundant decode signal 105-2 of the redundant decoder 15 is logic "1"(as noted, the redundant decode signal 105-1 is logic "0"). Thus, the 2nd output set circuit $601_2$ generates the select code S-2 equal to "00000001". Referring to FIG. 9, the switch device $90_8$ of the 2nd output select circuit $602_2$ is made conductive according to the select code S-2, e.g., [op1:op8]= "00000001". Consequently, the data line 102-8 is coupled to the redundant column 14B-2 instead of the defective column 11B-8.

Compared to the prior art, the total number of fuses in the redundant switch circuit of the invention can be reduced. The reduction in the number of fuses reduces the charce of error when the fuses are cut, and thus decreases the neighborhood interference fault between data lines of the data bus. Additionally, a semiconductor memory device incorporating the redundant switch circuit of the invention is provided to increase the manufacture yield by protecting data lines from the neighborhood interference fault.

The redundant switch circuit of the invention can be applied in various memory devices, such as dynamic random access memory (DRAY), static random access memory and read only memory (ROM). If it is applied in an SRAM, each ordinary column includes a pair of complementary bit lines, and each redundant column also includes a pair of complementary bit lines. Thus, there is a pair of complementary data lines for an SRAM cell. While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A semiconductor memory device comprising:

an ordinary memory cell array, arranged in an M-column-by-N-row structure, comprising M ordinary columns each of which has N ordinary memory cells, and each ordinary column respectively coupled to a corresponding data line of a data bus, wherein M and N are a first and a second positive integers greater than one;

an ordinary decoder, connected to the ordinary memory cell array, and receiving a decode-inhibit signal and an address signal, for decoding the address signal to drive one of the ordinary memory cells when the decode-inhibit signal is de-asserted;

a redundant memory cell array, arranged in a P-column-by-N-row structure, including P redundant columns each of which has N redundant memory cells, and the P redundant columns adapted to replace defective columns in the M ordinary columns, in which a defective column $X_{m-p}$, where $1 \leq m \leq M$ and $1 \leq p \leq P$, represents an mth ordinary column identified as defective and replaced with a pth redundant column, and wherein P is a third positive integer greater than one;

a redundant decoder, connected to the redundant memory cell array and the ordinary decoder, comprising P redundant decode circuits respectively receiving a column address of the address signal, in which a pth redundant decode circuit provides a pth redundant decode signal to the pth redundant column in the redundant memory cell array for driving the pth redundant column when the pth redundant decode circuit receives the column address indicative of the defective column $X_{m-p}$;

a redundant switch circuit having P redundant output switches, in which a pth redundant output switch, responsive to the pth redundant decode signal and a pth select code, couples the pth redundant column to a mth data line of the data bus corresponding to the defective column $X_{m-p}$; and a pth output set circuit, incorporated in the pth redundant output switch, comprising:

k fuses working in conjunction with a plurality of transistors, in which the k fuses are selectively cut to set k logic signal values and respective complements thereof; and M logic circuits, for decoding the k logic signal values and the complements thereof into the pth select code when the pth redundant decode signal is asserted, where $k<M\leqq 2^k$.

2. The semiconductor memory device of claim 1 wherein the pth redundant output switch comprises:

a pth output select circuit, having an input terminal coupled to the pth redundant column and having M output terminals respectively coupled to the corresponding data lines, for selectively coupling the pth redundant column to the mth data line of the data bus corresponding to the defective column $X_{m-p}$ when the pth select code is received.

3. A redundant output switch for use in a semiconductor memory device having an ordinary memory cell array and a redundant memory cell array, the redundant output switch allowing an ordinary column in the ordinary memory cell array to be replaced with a redundant column in the redundant memory cell array if the ordinary column is identified as a defective column, the ordinary memory cell array including a total of M ordinary columns, the switch comprising:

an output set circuit comprising:

k fuses working in conjunction with a plurality of transistors, in which the k fuses are selectively cut to set k logic signal values and respective complements thereof; and M logic circuits, for decoding the k logic signal values and the complements thereof into a select code when a redundant decode signal is asserted, where $k<M\leqq 2^k$; and an output select circuit, having an input terminal coupled to the redundant column and having M output terminals respectively coupled to the M ordinary columns in the ordinary memory cell array, for selectively coupling the redundant column to the defective column when the select code is received.

4. The redundant output switch of claim 3 wherein the ordinary memory cell array comprises M ordinary columns, the output set circuit comprises k fuses and where $k<M\leqq 2^k$.

5. The redundant output switch of claim 3 wherein the select code is binary encoded according to selective cutting of the k fuses.

* * * * *